US011514206B2

(12) United States Patent
Wu et al.

(10) Patent No.: US 11,514,206 B2
(45) Date of Patent: Nov. 29, 2022

(54) METHOD, APPARATUS, AND STORAGE MEDIUM FOR PLANNING POWER DISTRIBUTION NETWORK

(71) Applicant: Tsinghua University, Beijing (CN)

(72) Inventors: Wenchuan Wu, Beijing (CN); Boming Zhang, Beijing (CN); Zihao Li, Beijing (CN); Hongbin Sun, Beijing (CN); Bin Wang, Beijing (CN); Qinglai Guo, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 119 days.

(21) Appl. No.: 17/136,941

(22) Filed: Dec. 29, 2020

(65) Prior Publication Data
US 2021/0117586 A1    Apr. 22, 2021

Related U.S. Application Data

(63) Continuation of application No. PCT/CN2019/100599, filed on Aug. 14, 2019.

(30) Foreign Application Priority Data

May 24, 2019    (CN) .......................... 201910438855.5

(51) Int. Cl.
*G05B 19/042*    (2006.01)
*H02J 3/00*    (2006.01)
*G06F 30/13*    (2020.01)

(52) U.S. Cl.
CPC ........... *G06F 30/13* (2020.01); *G05B 19/042* (2013.01); *H02J 3/00* (2013.01); *G05B 2219/2639* (2013.01); *H02J 2203/20* (2020.01)

(58) Field of Classification Search
CPC .................. G06F 30/13; G05B 19/042; G05B 2219/2639; H02J 3/00; H02J 2203/20;
(Continued)

(56) References Cited

U.S. PATENT DOCUMENTS

2019/0042960 A1*    2/2019    Lindner ................ G06F 30/367

FOREIGN PATENT DOCUMENTS

CN        108964098        12/2018

OTHER PUBLICATIONS

WIPO, ISR for PCT/CN2019/100599, dated Feb. 20, 2020.

* cited by examiner

*Primary Examiner* — Thomas C Lee
*Assistant Examiner* — Charles Cai
(74) *Attorney, Agent, or Firm* — Hodgson Russ LLP

(57) ABSTRACT

The disclosure provides a method for planning a power distribution network, an apparatus for planning a power distribution network, and a storage medium. The method includes: establishing a model for planning the power distribution network, the model including a target function and constraints, the target function for minimizing a cost of the power distribution network when branches and nodes are installed into the power distribution network, the nodes including transformers and substations, the constraints including a power balance constraint of the power distribution network, a power constraint of the branches, a power constraint of the transformers, a radial operation constraint of the power distribution network, a fault constraint, a calculation constraint of indices of a reliability, a constraint of the indices of the reliability, and a logic constraint; and solving the model to determine whether the branches and the nodes are installed into the power distribution network.

14 Claims, 1 Drawing Sheet establishing a model for planning the power distribution network ⟵ 110 solving the model to obtain the conductors, the transformers, and the substations for planning the power distribution network ⟵ 120

(58) Field of Classification Search
CPC ...... H02J 2203/10; Y02E 40/70; Y02E 60/00; Y04S 10/50; Y04S 40/20; G06Q 10/0631; G06Q 50/06; G06Q 10/04; G06Q 10/0637; G06Q 10/06393

See application file for complete search history.

METHOD, APPARATUS, AND STORAGE MEDIUM FOR PLANNING POWER DISTRIBUTION NETWORK

CROSS REFERENCE TO RELATED APPLICATION

This application is a continuation of International Application No. PCT/CN2019/100599, filed on Aug. 14, 2019, which claims priority to Chinese Patent Application No. 201910438855.5, filed on May 24, 2019, the entire contents of which are incorporated herein by reference.

FIELD

The disclosure relates to the field of planning and evaluation technologies in electrical power systems, and more particularly to a method for planning a power distribution network, an apparatus for planning a power distribution network, and a storage medium.

BACKGROUND

Reliability is an important index of evaluating a performance of a planned power distribution network in a problem of planning the power distribution network. The reliability refers to an ability of the planned power distribution network to continuously satisfy quality and quantity of power demand for a number of customers. However, a requirement of reliability in the planned power distribution network in related arts may not be satisfied.

SUMMARY

According to a first aspect of embodiments of the disclosure, there is provided a method for planning a power distribution network. The method includes: establishing a model for planning the power distribution network, the model including a target function and constraints, the target function for minimizing a cost of the power distribution network when conductors, transformers, and substations are installed in the power distribution network, the constraints including a power balance constraint of the power distribution network, a power constraint of branches in the power distribution network, a power constraint of transformers in the power distribution network, a radial operation constraint of the power distribution network, a fault constraint, a calculation constraint of indices of a reliability, a constraint of the indices of the reliability, and a logic constraint; and solving the model to obtain the conductors, the transformers, and the substations for planning the power distribution network.

According to a second aspect of embodiments of the disclosure, there is provided an apparatus for planning a power distribution network. The apparatus includes a processor; and a memory for storing instructions executable by the processor. The processor is configured to carry out the above method.

According to a third aspect of embodiments of the disclosure, there is provided a non-transitory computer-readable storage medium having stored therein instructions that, when executed by a processor of a terminal, causes the terminal to perform the above method.

BRIEF DESCRIPTION OF THE DRAWINGS

The accompanying drawings, which are incorporated in and constitute a part of this specification, illustrate embodiments consistent with the disclosure and, together with the description, explain the principles of the disclosure.

DETAILED DESCRIPTION

The reliability of the power distribution network may include the following indices: a customer interruption frequency (CIF), a customer interruption duration (CID), a system average interruption frequency index (SAIFI), a system average interruption duration index (SAIDI), and an expected energy not supplied (EENS).

The indices of the reliability may be calculated by counting probabilities of fault events and durations of fault events. In the conventional method for planning the power distribution network, a two-step iteration method is employed. A planning model without considering the reliability is established and solved and the indices of the reliability are calculated based on the solved result in the first step, and then the indices of the reliability are verified in the second step, and if the verification fails, it returns to solving the planning model in the first step after updating iteration parameters, and if the verification successes, a planning solution satisfying the requirement of reliability may be generated. When the indices of the reliability are calculated, a plurality of Monte Carlo samples are generated based on device faults and fault rates through a random generation simulation based on the solved result, and the plurality of Monte Carlo samples are counted to obtain the indices of the reliability.

However, the two-step iteration method may take a long period of time, occupy a large storage space, and often obtain a suboptimal planning solution with electrical devices having low capacities and low loads, such that a cost of the planned power distribution network is higher and the requirement of reliability of the planned power distribution network may not be satisfied.

The disclosure provides a solution for planning the power distribution network by considering a reliability constraint. With the disclosure, calculating accurately the indices of the reliability of the power distribution network may be incorporated into a model for planning the power distribution network as a constraint, which refers to the reliability constraint, such that the model is solved to obtain directly a planning solution satisfying the indices of the reliability, thereby avoiding an iterative calculation of the conventional planning of the power distribution network, and ensuring an optimality of the planning solution. Detailed description of the solution of the disclosure is further made with reference to detailed embodiments.

A method for planning the power distribution network by considering the reliability constraint is provided in the disclosure.

Figure 1:
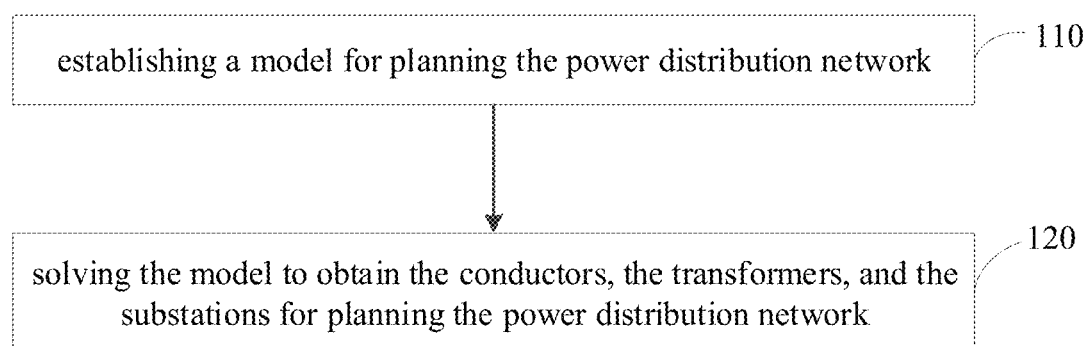
FIG. 1 is a flowchart illustrating a method for planning a power distribution network, according to some embodiments.

FIG. 1 is a flowchart illustrating a method for planning a power distribution network, according to some embodiments. As illustrated in FIG. 1, the method includes the following.

At block 110, a model for planning the power distribution network is established.

The model includes a target function and constraints.

The target function is for minimizing a cost of the power distribution network when conductors, transformers, and substations are installed in the power distribution network.

The constraints include a power balance constraint of the power distribution network, a power constraint of branches in the power distribution network, a power constraint of transformers in the power distribution network, a radial operation constraint of the power distribution network, a fault constraint, a calculation constraint of indices of a reliability, a constraint of the indices of the reliability, and a logic constraint.

At block 120, the model is solved to obtain the conductors, the transformers, and the substations for planning the power distribution network.

The detail method may be described as follows.

(1) The model for planning the power distribution network is established based on the reliability constraint, and the model includes the target function and the constraint conditions.

(1-1) The target function of the model is determined.

The target function is a minimum cost of the power distribution network, and denoted by a formula of:

$$\text{Minimize: } C^I = \sum_{ij \in \Upsilon} \sum_{a \in \Lambda^B} c_B^a l_{ij}^a + \sum_{f \in \Psi^F} \sum_{e \in \Lambda^T} c_T^e o_f^e + \sum_{s \in \Psi^{SS}} c_s^{SS} u_s \quad (1)$$

where:

$C^I$ represents the cost of the power distribution network, a represents a conductor type, $c_B^a$ represents a cost of a conductor with the conductor type a, $l_{ij}^a \in \{0,1\}$ represents whether the conductor with the conductor type a is installed newly in a branch ij, $l_{ij}^a = 1$ represents that the conductor with the conductor type a is installed newly in the branch ij, $l_{ij}^a = 0$ represents that the conductor with the conductor type a is not installed newly in the branch ij, $\Upsilon$ represents a set of all branches, $\Lambda^B$ represents a set of conductor types, e represents a transformer type, $c_T^e$ represents a cost of a transformer with the transformer type e, $o_f^e \in \{0,1\}$ represents whether the transformer with the transformer type e is installed newly in a transformer node f, $o_f^e = 1$ represents that the transformer with the transformer type e is installed newly in the transformer node f, $o_f^e = 0$ represents that the transformer with the transformer type e is not installed newly in the transformer node f, $\Psi^F$ represents a set of transformer nodes, $\Lambda^T$ represents a set of transformer types, $c_s^{SS}$ represents a cost of a substation newly-installed, $u_s \in \{0,1\}$ represents whether the substation is installed newly in a substation node s, $u_s = 1$ represents that the substation is installed newly in the substation node s, $u_s = 0$ represents the substation is not installed newly in the substation node s, and $\Psi^{SS}$ represents a set of substation nodes.

(1-2) The constraints are determined.

(1-2-1) The power balance constraint of the power distribution network is denoted by formulas of:

$$D_i^{xy} = \sum_{j \in \Psi_i} P_{ji}^{xy}, \forall i \in \Psi^{LN}, \forall xy \in \Upsilon \cup \{0\} \quad (2)$$

$$P_{ij}^{xy} = -P_{ji}^{xy}, \forall ij \in \Upsilon, \forall xy \in \Upsilon \cup \{0\} \quad (3)$$

where:

$D_i^{xy}$ represents a load of a node i when a fault occurs in a branch xy, xy=0 represents that the branch xy is in a normal operating state, $P_{ij}^{xy}$ represents a power of a branch ij flowing from the node i to a node j when the fault occurs in the branch xy, $P_{ji}^{xy}$ represents a power of the branch ij flowing from the node j to the node i when the fault occurs in the branch xy, $\Psi_i$ represents a set of branches directly coupled to the node i, and $\Psi^{LN}$ represents a set of nodes having loads.

(1-2-2) The power balance constraint of the power distribution network is denoted by formulas of:

$$D_i^{xy} = \sum_{j \in \Psi_i} P_{ji}^{xy}, \forall i \in \Psi^{LN}, \forall xy \in \Upsilon \cup \{0\} \quad (4)$$

$$P_{ij}^{xy} = -P_{ji}^{xy}, \forall ij \in \Upsilon, \forall xy \in \Upsilon \cup \{0\} \quad (5)$$

where:

M represents any large number (which needs to be greater than a maximum capacity max($P_{ij}^C$) of all the branches in the power distribution network, and is taken as 1000000000 in this embodiment), $P_{ij}^C$ represents a rated capacity of the branch ij, $k_{ij}^{xy} \in \{0,1\}$ represents a state of a switch in the branch ij when the fault occurs in the branch xy (when xy=0, the branch xy is in the normal operating state), $k_{ij}^{xy}=1$ represents that the switch is turned off, $k_{ij}^{xy}=0$ represents that the switch is turned on.

(1-2-3) The power constraint of the transformers is denoted by formulas of:

$$P_f^{xy} = P_{tr^f}^{xy}, \forall f \in \Psi^F, tr^f \in \Upsilon, \forall xy \in \Upsilon \cup \{0\} \quad (6)$$

$$P_f^{xy} \leq P_f^C, \forall f \in \Psi^F, \forall xy \in \Upsilon \cup \{0\} \quad (7)$$

where:

$P_f^{xy}$ represents a power of a transformer f when the fault occurs in the branch xy (when xy=0, the branch xy is in the normal operating state), $P_{tr^f}^{xy}$ represents a power of a branch $tr^f$ coupled to the transformer and flowing from a node of the transformer to a downstream node when the fault occurs in the branch xy (when xy=0, the branch xy is in the normal operating state).

(1-2-4) The radial operation constraint of the power distribution network is denoted by formulas of:

$$-(1-k_{ij}^{xy})M + F_i^{f,xy} \leq F_{ij}^{f,xy} \leq (1-k_{ij}^{xy})M + F_i^{f,xy}, \quad (8)$$

$$\forall ij \in \Upsilon, \forall f \in \Psi^F, \forall xy \in \Upsilon \cup \{0\}$$

$$-(1-k_{ij}^{xy})M + F_j^{f,xy} \leq F_{ij}^{f,xy} \leq (1-k_{ij}^{xy})M + F_j^{f,xy}, \quad (9)$$

$$\forall ij \in \Upsilon, \forall f \in \Psi^F, \forall xy \in \Upsilon \cup \{0\}$$

$$F_{tr^f}^{f,xy} = k_{tr^f}^{xy}, \forall f \in \Psi^F, tr^f \in \Upsilon, \forall xy \in \Upsilon \cup \{0\} \quad (10)$$

$$F_{ij}^{f,xy} \leq k_{ij}^{xy}, \forall ij \in \Upsilon, \forall f \in \Psi^F, \forall xy \in \Upsilon \cup \{0\} \quad (11)$$

$$\sum_f F_i^{f,xy} \leq 1, \forall i \in \Psi^{LN}, \forall xy \in \Upsilon \cup \{0\} \quad (12)$$

$$\sum_f F_{ij}^{f,xy} \leq 1, \forall ij \in \Upsilon, \forall xy \in \Upsilon \cup \{0\} \quad (13)$$

$$0 \leq F_i^{f,xy} \leq 1, \forall i \in \Psi^{LN}, \forall f \in \Psi^F, \forall xy \in \Upsilon \cup \{0\} \quad (14)$$

-continued $$0 \leq F_{ij}^{f,xy} \leq 1, \forall ij \in \Upsilon, \forall f \in \Psi^F, \forall xy \in \Upsilon \cup \{0\} \quad (15)$$

$$\sum_{ij\in\Upsilon} k_{ij}^{xy} = \sum_{i\in\Psi^{LN}} q_i^{xy}, \forall xy \in \Upsilon \cup \{0\} \quad (16)$$

where, $F_i^{f,xy}$ represents a dependent marker of the node i related to the transformer f when the fault occurs in the branch xy (when xy=0, the branch xy is in the normal operating state), $F_i^{f,xy}=1$ represents that the node i is powered by the transformer f, $F_i^{f,xy}=0$ represents that the node i is not powered by the transformer f, $F_{ij}^{f,xy}$ represents a dependent marker of the branch ij related to the transformer f when the fault occurs in the branch xy (when xy=0, the branch xy is in the normal operating state), $F_{ij}^{f,xy}=1$ represents that the branch ij is powered by the transformer f, $F_{ij}^{f,xy}=0$ represents the branch ij is not powered by the transformer f, $q_i^{xy} \in \{0,1\}$ represents whether the node i is powered when the fault occurs in the branch xy (when xy=0, the branch xy is in the normal operating state), $q_i^{xy}=1$ represents that the node i is powered when the fault occurs in the branch xy, and $q_i^{xy}=0$ represents that the node i is not powered when the fault occurs in the branch xy.

(1-2-5) The fault constraint is denoted by formulas of:

$$k_{xy}^{xy}=0, \forall xy \in \Upsilon \quad (17)$$

$$F_i^{f,0}+F_{xy}^{f,0}-1 \leq p_i^{xy}, \forall f \in \Psi^F, \forall i \in \Psi^{LN}, \forall xy \in \Upsilon \quad (18)$$

$$1-p_i^{xy} \leq q_i^{xy}, \forall i \in \Psi^{LN}, \forall xy \in \Upsilon \quad (19)$$

$$D_i^{xy}=D_i^0 q_i^{xy}, \forall i \in \Psi^{LN}, \forall xy \in \Upsilon \quad (20)$$

where, $p_i^{xy} \in \{0,1\}$ represents whether the node i is affected when the fault occurs in the branch xy, $p_i^{xy}=1$ represents that the node i is affected when the fault occurs in the branch xy, and $p_i^{xy}=0$ represents that the node i is not affected when the fault occurs in the branch xy.

(1-2-6) The calculation constraint of the indices of the reliability is denoted by formulas of:

$$CID_i = \sum_{xy\in\Upsilon} \lambda_{xy} \tau_{xy}^{SW} p_i^{xy} + \sum_{xy\in\Upsilon} \lambda_{xy}(\tau_{xy}^{RP} - \tau_{xy}^{SW})(1-q_i^{xy}), \quad (21)$$

$$\forall i \in \Psi^{LN}$$

$$CIF_i = \sum_{xy\in\Upsilon} \lambda_{xy} p_i^{xy}, \forall i \in \Psi^{LN} \quad (22)$$

$$SAIDI = \frac{\sum_{i\in\Psi^{LN}} NC_i CID_i}{\sum_{i\in\Psi^{LN}} NC_i} \quad (23)$$

$$SAIFI = \frac{\sum_{i\in\Psi^{LN}} NC_i CIF_i}{\sum_{i\in\Psi^{LN}} NC_i} \quad (24)$$

$$ASAI = 1 - \frac{SAIDI}{8760} \quad (25)$$

$$EENS = \sum_{h\in B} \frac{\Delta_h}{8760} \sum_{i\in\Psi^{LN}} CID_i \mu_h L_i \quad (26)$$

where, $CID_i$ represents a customer interruption duration of a node i, $\lambda_{xy}$ represents an annual fault rate of a branch xy (if xy=tr$^f$, f$\in \Psi^F$, the branch xy represents the transformer f), $\tau_{xy}^{SW}$ represents an interruption duration of the branch xy from a fault occurrence to a load restoration is applied (if xy=tr$^f$, f$\in \Psi^F$, the branch xy represents the transformer f), $\tau_{xy}^{RP}$ represents an interruption duration of the branch xy from the fault occurrence to the fault) is repaired (if xy=tr$^f$, f$\in \Psi^F$, the branch xy represents the transformer f), $p_i^{xy} \in \{0,1\}$ represents whether a node i is affected when a fault occurs in a branch xy, $p_i^{xy}=1$ represents that the node i is affected when the fault occurs in the branch xy, and $p_i^{xy}=0$ represents that the node i is not affected when the fault occurs in the branch xy, $q_i^{xy} \in \{0,1\}$ represents whether the node i is powered when the fault occurs in the branch xy, $q_i^{xy}=1$ represents that the node i is powered when the fault occurs in the branch xy, and $q_i^{xy}=0$ represents that the node i is not powered when the fault occurs in the branch xy, $\Psi^{LN}$ represents a set of nodes having loads, $CIF_i$ represents a customer interruption frequency of the node i, SAIDI represents a system average interruption duration index, SAIFI represents a system average interruption frequency index, $NC_i$ represents a number of customers of the node i, ASAI represents a system average power-supply index, EENS represents an expected energy not supplied, B represents a set of all load levels, $\Delta_h$ represents a number of annual duration hours of a load level h, $\mu_h \leq 1$ represents a peak load ratio of the load level h, and $L_i$ represents a peak load of the node i.

(1-2-7) The constraint of the indices of the reliability is denoted by formulas of:

$$CID_i \leq \varepsilon_i, \forall i \in \Psi^{LN} \quad (27)$$

$$SAIDI \leq \varepsilon \quad (28)$$

where, $\varepsilon_i$ represents a requirement for the customer interruption duration (usually 5 minutes to 3 hours), and $\varepsilon$ represents a requirement for the system average interruption duration (usually 5 minutes to 3 hours).

(2-8) The logic constraint is denoted by formulas of:

$$l_{ij} = \sum_{a\in\Lambda^B} l_{ij}^a, \forall ij \in \Upsilon \quad (29)$$

$$P_{ij}^C = \sum_{a\in\Lambda^B} C_B^a l_{ij}^a, \forall ij \in \Upsilon \quad (30)$$

$$k_{ij}^{xy} \leq l_{ij}, \forall ij \in \Upsilon, \forall xy \in \Upsilon \cup \{0\} \quad (31)$$

$$o_f = \sum_{a\in\Lambda^T} o_f^e, \forall f \in \Psi^F \quad (32)$$

$$P_f^C = \sum_{a\in\Lambda^T} o_f^e C_T^e, \forall f \in \Psi^F \quad (33)$$

$$\sum_{f\in\Psi_s^{SS}} o_f \leq Mu_s, \forall s \in \Psi^{SS} \quad (34)$$

where, $l_{ij} \in \{0,1\}$ represents whether there is a branch ij, $l_{ij}=1$ represents that there is the branch ij, $l_{ij}=0$ represents that there is no branch ij, $C_B^a$ represents a rated capacity of the conductor with the conductor type a, $P_{ij}^C$ represents a rated capacity of the branch ij, $k_{ij}^{xy} \in \{0,1\}$ represents a state of a switch in the branch ij when a fault occurs in a branch xy, $k_{ij}^{xy}=1$ represents that the switch is turned off, $k_{ij}^{xy}=0$ represents that the switch is turned on, $o_f \in \{0,1\}$ represents whether there is a newly-installed node f, $o_f=1$ represents that there is the newly-installed node f, $o_f=0$ represents that there is no the newly-installed node f, $C_T^a$ represents that a rated capacity of the newly-installed transformer with the transformer type e, $P_f^C$ represents a capacity of the transformer f, M represents a positive number, and $\Psi_s^{SS}$ represents a set of transformers belonging to a substation node s.

(2) The model is solved based on the target function (1) and the constraints (2)-(34) to obtain $l_{ij}^a$, $o_f^a$ and $u_s$, which are optimum solutions of the power distribution network.

In embodiments of the disclosure, the model is solved by a branch and bound method, which is common for those skilled in the art.

Figure 2:
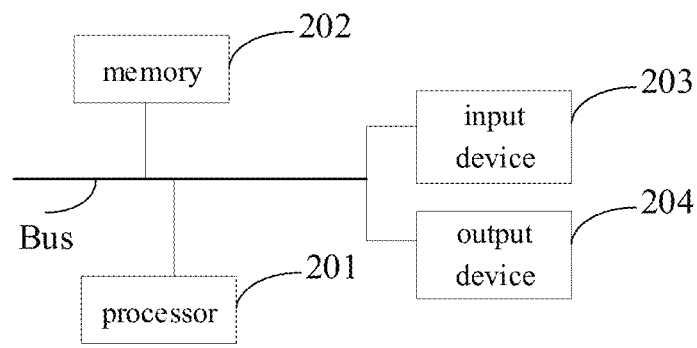
FIG. 2 is a block diagram illustrating an apparatus for planning a power distribution network, according to some embodiments.

FIG. 2 is a block diagram of a computer for implementing the above method according to some embodiments of the disclosure. The computers are intended to represent various forms of digital computers, such as laptop computers, desktop computers, workbenches, personal digital assistants, mainframe computers, and other suitable computers. The computers may also represent various forms of mobile devices, such as personal digital processing, cellular phones, smart phones, wearable devices, and other similar computing devices. The components shown here, their connections and relations, and their functions are merely examples, and are not intended to limit to the implementation of the disclosure described and/or required herein.

As illustrated in FIG. 2, the computer includes: one or more processors 201, a memory 202, and interfaces for connecting various components, including high-speed interfaces and low-speed interfaces. The various components are interconnected using different buses and can be mounted on a common mainboard or otherwise installed as required. The processor may process instructions executed within the computer, including instructions stored in the memory or on the memory to display graphical information of the GUI (Graphical User Interface) on an external input/output device such as a display device coupled to the interface. In other embodiments, a plurality of processors and/or buses can be used with a plurality of memories and processors, if desired. Similarly, a plurality of computers can be connected, each providing some of the necessary operations. A processor 201 is taken as an example in FIG. 2.

The memory 202 is a non-transitory computer-readable storage medium according to the disclosure. The memory stores instructions executable by at least one processor, so that the at least one processor executes the above method. The non-transitory computer-readable storage medium of the disclosure stores computer instructions that are configured to cause a computer to execute the method (the method as illustrated in FIG. 1).

As the non-transitory computer-readable storage medium, the memory 202 is configured to store non-transitory software programs, non-transitory computer executable programs and modules, such as program instructions/modules corresponding to the above method. The processor 201 executes various functional applications and data processing of the computer by running non-transitory software programs, instructions, and modules stored in the memory 202, that is, implementing the above method in the foregoing embodiment of FIG. 1.

The memory 202 may include a storage program area and a storage data area, where the storage program area may store an operating system and application programs required for at least one function. The storage data area may store data created according to the use of the computer, and the like. In addition, the memory 202 may include a high-speed random-access memory, and a non-transitory memory, such as at least one magnetic disk storage device, a flash memory device, or other non-transitory solid-state storage device. In some embodiments, the memory 202 may optionally include a memory remotely disposed with respect to the processor 201, and these remote memories may be connected to the computer through a network. Examples of the above network include, but are not limited to, the Internet, an intranet, a local area network, a mobile communication network, and combinations thereof.

The computer may further include an input device 203 and an output device 204. The processor 201, the memory 202, the input device 203, and the output device 204 may be connected through a bus or in other manners. In FIG. 2, the connection through the bus is taken as an example.

The input device 203 may receive inputted numeric or character information, and generate key signal inputs related to user settings and function control of the computer, such as a touch screen, a keypad, a mouse, a trackpad, a touchpad, an indication rod, one or more mouse buttons, trackballs, joysticks and other input devices. The output device 204 may include a display device, an auxiliary lighting device (for example, an LED), a haptic feedback device (for example, a vibration motor), and the like. The display device may include, but is not limited to, a liquid crystal display (LCD), a light emitting diode (LED) display, and a plasma display. In some embodiments, the display device may be a touch screen.

Various embodiments of the systems and technologies described herein may be implemented in digital electronic circuit systems, integrated circuit systems, application specific integrated circuits (ASICs), computer hardware, firmware, software, and/or combinations thereof. These various embodiments may be implemented in one or more computer programs, which may be executed and/or interpreted on a programmable system including at least one programmable processor. The programmable processor may be dedicated or general-purpose programmable processor that receives data and instructions from a storage system, at least one input device, and at least one output device, and transmits the data and instructions to the storage system, the at least one input device, and the at least one output device.

These computing programs (also known as programs, software, software applications, or code) include machine instructions of a programmable processor and may utilize high-level processes and/or object-oriented programming languages, and/or assembly/machine languages to implement these calculation procedures. As used herein, the terms "machine-readable medium" and "computer-readable medium" refer to any computer program product, device, and/or device used to provide machine instructions and/or data to a programmable processor (for example, magnetic disks, optical disks, memories, programmable logic devices (PLDs), including machine-readable media that receive machine instructions as machine-readable signals. The term "machine-readable signal" refers to any signal used to provide machine instructions and/or data to a programmable processor.

In order to provide interaction with a user, the systems and techniques described herein may be implemented on a computer having a display device (e.g., a Cathode Ray Tube (CRT) or a Liquid Crystal Display (LCD) monitor for displaying information to a user); and a keyboard and a pointing device (such as a mouse or trackball) through which the user can provide input to the computer. Other kinds of devices may also be used to provide interaction with the user. For example, the feedback provided to the user may be any form of sensory feedback (e.g., visual feedback, auditory feedback, or haptic feedback), and the input from the user may be received in any form (including acoustic input, voice input, or tactile input).

The systems and technologies described herein can be implemented in a computing system that includes background components (for example, a data server), or a computing system that includes middleware components (for example, an application server), or a computing system that includes front-end components (For example, a user computer with a graphical user interface or a web browser, through which the user can interact with the implementation of the systems and technologies described herein), or include such background components, intermediate computing components, or any combination of front-end components. The components of the system may be interconnected by any form or medium of digital data communication (egg, a communication network). Examples of communication networks include: local area network (LAN), wide area network (WAN), and the Internet.

It should be understood that the various forms of processes shown above can be used to reorder, add, or delete steps. For example, the steps described in this disclosure can be executed in parallel, sequentially, or in different orders, as long as the desired results of the technical solutions disclosed in this disclosure can be achieved, which is no limited herein.

The foregoing specific implementations do not constitute a limitation on the protection scope of the present disclosure. It should be understood by those skilled in the art that various modifications, combinations, sub-combinations, and substitutions may be made according to design requirements and other factors. Any modification, equivalent replacement and improvement made within the spirit and principle of this disclosure shall be included in the protection scope of this disclosure.

What is claimed is:

1. A method for planning a power distribution network, comprising:
   establishing a model for planning the power distribution network,
   the model comprising a target function and constraints,
   the target function for minimizing a cost of the power distribution network when conductors, transformers, and substations are installed in the power distribution network,
   the constraints comprising a power balance constraint of the power distribution network, a power constraint of branches in the power distribution network, a power constraint of transformers in the power distribution network, a radial operation constraint of the power distribution network, a fault constraint, a constraint of indices of a reliability, a calculation definition of the constraint of the indices of the reliability, and a logic constraint;
   solving the model to obtain a solution about placing the conductors, the transformers, and the substations for planning the power distribution network; and
   planning and operating the power distributed network based on the obtained solution.

2. The method of claim 1, wherein the target function is denoted by a formula of:

$$\text{Minimize: } C^I = \sum_{ij \in \Upsilon} \sum_{a \in \Lambda^B} c_B^a l_{ij}^a + \sum_{f \in \Psi^F} \sum_{e \in \Lambda^T} c_T^e o_f^e + \sum_{s \in \Psi^{SS}} c_s^{SS} u_s \quad (1)$$

where:
   $C^I$ represents the cost of the power distribution network,
   a represents a conductor type,
   $c_B^a$ represents a cost of a conductor with the conductor type a,
   $l_{ij}^a \in \{0,1\}$ represents whether the conductor with the conductor type a is installed newly in a branch ij, $l_{ij}^a = 1$ represents that the conductor with the conductor type a is installed newly in the branch ij, $l_{ij}^a = 0$ represents that the conductor with the conductor type a is not installed newly in the branch ij,
   Y represents a set of all branches,
   $\Lambda^B$ represents a set of conductor types,
   e represents a transformer type,
   $c_T^e$ represents a cost of a transformer with the transformer type e,
   $o_f^e \in \{0,1\}$ represents whether the transformer with the transformer type e is installed newly in a transformer node f, $o_f^e = 1$ represents that the transformer with the transformer type e is installed newly in the transformer node f, $o_f^e = 0$ represents that the transformer with the transformer type e is not installed newly in the transformer node f,
   $\Psi^F$ represents a set of transformer nodes,
   $\Lambda^T$ represents a set of transformer types,
   $c_s^{SS}$ represents a cost of a substation newly-installed,
   $u_s \in \{0,1\}$ represents whether the substation is installed newly in a substation node s, $u_s = 1$ represents that the substation is installed newly in the substation node s, $u_s = 0$ represents the substation is not installed newly in the substation node s, and
   $\Psi^{SS}$ represents a set of substation nodes.

3. The method of claim 2, wherein the power balance constraint of the power distribution network is denoted by formulas of:

$$D_i^{xy} = \sum_{j \in \Psi_i} P_{ji}^{xy}, \forall i \in \Psi^{LN}, \forall xy \in \Upsilon \cup \{0\} \quad (2)$$

$$P_{ij}^{xy} = -P_{ji}^{xy}, \forall ij \in \Upsilon, \forall xy \in \Upsilon \cup \{0\} \quad (3)$$

where:
   $D_i^{xy}$ represents a load of a node i when a fault occurs in a branch xy,
   xy=0 represents that the branch xy is in a normal operating state,
   $P_{ij}^{xy}$ represents a power of the branch ij flowing from the node i to a node j when the fault occurs in the branch xy,
   $P_{ji}^{xy}$ represents a power of the branch ij flowing from the node j to the node i when the fault occurs in the branch xy,
   $\Psi_i$ represents a set of branches directly coupled to the node i, and
   $\Psi^{LN}$ represents a set of nodes having loads.

4. The method of claim 2, wherein the power constraint of branches is denoted by formulas of:

$$-Mk_{ij}^{xy} \leq Mk_{ij}^{xy}, \forall ij \in Y, \forall xy \in Y \cup \{0\} \quad (4)$$

$$-P_{ij}^C \leq P_{ij}^{xy} \leq P_{ij}^C, \forall ij \in Y, \forall xy \in Y \cup \{0\} \quad (5)$$

where:
M represents a positive number,
$k_{ij}^{xy} \in \{0,1\}$ represents a state of a switch in the branch ij when a fault occurs in a branch xy, $k_{ij}^{xy}$ represents that the switch is turned off, $k_{ij}^{xy}=0$ represents that the switch is turned on,
$P_{ij}^{xy}$ represents a power of the branch ij flowing from a node i to a node j when the fault occurs in the branch xy, and
$P_{ij}^C$ represents a rated capacity of the branch ij.

5. The method of claim 2, wherein the power constraint of transformers is denoted by formulas of:

$$P_f^{xy}=P_{tr^f}^{xy}, \forall f \in \Psi^F, tr^f \in Y, \forall xy \in Y \cup \{0\} \quad (6)$$

$$P_f^{xy} \leq P_f^C, \forall f \in \Psi^F, \forall xy \in Y \cup \{0\} \quad (7)$$

where:
$P_f^{xy}$ represents a power of a transformer f when the fault occurs in the branch xy,
$P_{tr^f}^{xy}$ represents a power of a branch $tr^f$ coupled to the transformer f and flowing from the transformer f to a downstream node when the fault occurs in the branch xy, and
$P_f^C$ represents a capacity of the transformer f.

6. The method of claim 2, wherein the radial operation constraint of the power distribution network is denoted by formulas of:

$$-(1-k_{ij}^{xy})M + F_i^{f,xy} \leq F_{ij}^{f,xy} \leq (1-k_{ij}^{xy})M + F_i^{f,xy}, \quad (8)$$
$$\forall ij \in Y, \forall f \in \Psi^F, \forall xy \in Y \cup \{0\}$$

$$-(1-k_{ij}^{xy})M + F_j^{f,xy} \leq F_{ij}^{f,xy} \leq (1-k_{ij}^{xy})M + F_j^{f,xy}, \quad (9)$$
$$\forall ij \in Y, \forall f \in \Psi^F, \forall xy \in Y \cup \{0\}$$

$$F_{tr^f}^{f,xy} = k_{tr^f}^{xy}, \forall f \in \Psi^F, tr^f \in Y, \forall xy \in Y \cup \{0\} \quad (10)$$

$$F_{ij}^{f,xy} \leq k_{ij}^{xy}, \forall ij \in Y, \forall f \in \Psi^F, \forall xy \in Y \cup \{0\} \quad (11)$$

$$\sum_f F_i^{f,xy} \leq 1, \forall i \in \Psi^{LN}, \forall xy \in Y \cup \{0\} \quad (12)$$

$$\sum_f F_{ij}^{f,xy} \leq 1, \forall ij \in Y, \forall xy \in Y \cup \{0\} \quad (13)$$

$$0 \leq F_i^{f,xy} \leq 1, \forall i \in \Psi^{LN}, \forall f \in \Psi^F, \forall xy \in Y \cup \{0\} \quad (14)$$

$$0 \leq F_{ij}^{f,xy} \leq 1, \forall ij \in Y, \forall f \in \Psi^F, \forall xy \in Y \cup \{0\} \quad (15)$$

$$\sum_{ij \in Y} k_{ij}^{xy} = \sum_{i \in \Psi^{LN}} q_i^{xy}, \forall xy \in Y \cup \{0\} \quad (16)$$

where:
M represents a positive number,
$k_{ij}^{xy} \in \{0,1\}$ represents a state of a switch in the branch ij when a fault occurs in a branch xy, $k_{ij}^{xy}=1$ represents that the switch is turned off, $k_{ij}^{xy}=0$ represents that the switch is turned on,
$F_i^{f,xy}$ represents a dependent marker of the node i related to the transformer f when the fault occurs in the branch xy, $F_i^{f,xy}=1$ represents that the node i is powered by the transformer f, $F_i^{f,xy}=0$ represents that the node i is not powered by the transformer f,
$F_{ij}^{f,xy}$ represents a dependent marker of the branch ij related to the transformer f when the fault occurs in the branch xy, $F_{ij}^{f,xy}=1$ represents that the branch ij is powered by the transformer f, $F_{ij}^{f,xy}=0$ represents the branch ij is not powered by the transformer f,
$F_j^{f,xy}$ represents a dependent marker of a node j related to a transformer f when the fault occurs in the branch xy, $F_j^{f,xy}=1$ represents that the node j is powered by the transformer f, $F_j^{f,xy}=0$ represents that the node j is not powered by the transformer f,
$F_{tr^f}^{f,xy}$ represents a power of a branch $tr^f$ coupled to the transformer f and flowing from the transformer f to a downstream node when the fault occurs in the branch xy, $F_{tr^f}^{f,xy}=1$ represents that the branch $tr^f$ is powered by the transformer f, $F_{tr^f}^{f,xy}=0$ represents that the branch $tr^f$ is not powered by the transformer f,
$k_{tr^f}^{xy} \in \{0,1\}$ represents a state of a switch in the branch $tr^f$ when the fault occurs in the branch xy, $k_{tr^f}^{xy}=1$ represents that the switch is turned off, $k_{tr^f}^{xy}=0$ represents that the switch is turned on,
$q_i^{xy} \in \{0,1\}$ represents whether the node i is powered when the fault occurs in the branch xy, $q_i^{xy}=1$ represents that the node i is powered when the fault occurs in the branch xy, and $q_i^{xy}=0$ represents that the node i is not powered when the fault occurs in the branch xy, and
$\Psi^{LN}$ represents a set of nodes having loads.

7. The method of claim 2, wherein the fault constraint is denoted by formulas of:

$$k_{xy}^{xy}=0, \forall xy \in Y \quad (17)$$

$$F_i^{f,0} + F_{xy}^{f,0} - 1 \leq p_i^{xy}, \forall f \in \Psi^F, \forall i \in \Psi^{LN}, \forall xy \in Y \quad (18)$$

$$1-p_i^{xy} \leq q_i^{xy}, \forall i \in \Psi^{LN}, \forall xy \in Y \quad (19)$$

$$D_i^{xy} = D_i^0 q_i^{xy}, \forall i \in \Psi^{LN}, \forall xy \in Y \quad (20)$$

where:
$k_{xy}^{xy}$ represents a state of a switch in a branch xy when a fault occurs in the branch xy,
$F_i^{f,0}$ represents a dependent marker of a node i related to a transformer f under a normal operation condition,
$F_{xy}^{f,0}$ represents a dependent marker of the branch xy related to the transformer f under the normal operation condition,
$p_i^{xy} \in \{0,1\}$ represents whether the node i is affected when the fault occurs in the branch xy, $p_i^{xy}=1$ represents that the node i is affected when the fault occurs in the branch xy, and $p_i^{xy}=0$ represents that the node i is not affected when the fault occurs in the branch xy,
$q_i^{xy} \in \{0,1\}$ represents whether the node i is powered when the fault occurs in the branch xy, $q_i^{xy}=1$ represents that the node i is powered when the fault occurs in the branch xy, and $q_i^{xy}=0$ represents that the node i is not powered when the fault occurs in the branch xy,
$\Psi^{LN}$ represents a set of nodes having loads,
$D_i^{xy}$ represents a load of the node i when the fault occurs in the branch xy,
xy=0 represents that the branch xy is in a normal operating state, and
$D_i^0$ represents a load of the node i under the normal operation condition.

8. The method of claim 2, wherein the calculation definition of the constraint of the indices of the reliability is denoted by formulas of:

$$CID_i = \sum_{xy \in \Upsilon} \lambda_{xy} \tau_{xy}^{SW} p_i^{xy} + \sum_{xy \in \Upsilon} \lambda_{xy} (\tau_{xy}^{RP} - \tau_{xy}^{SW})(1 - q_i^{xy}), \quad (21)$$

$$\forall i \in \Psi^{LN}$$

$$CIF_i = \sum_{xy \in \Upsilon} \lambda_{xy} p_i^{xy}, \forall i \in \Psi^{LN} \quad (22)$$

$$SAIDI = \frac{\sum_{i \in \Psi^{LN}} NC_i CID_i}{\sum_{i \in \Psi^{LN}} NC_i} \quad (23)$$

$$SAIFI = \frac{\sum_{i \in \Psi^{LN}} NC_i CIF_i}{\sum_{i \in \Psi^{LN}} NC_i} \quad (24)$$

$$ASAI = 1 - \frac{SAIDI}{8760} \quad (25)$$

$$EENS = \sum_{h \in B} \frac{\Delta_h}{8760} \sum_{i \in \Psi^{LN}} CID_i \mu_h L_i \quad (26)$$

where:
$CID_i$ represents a customer interruption duration of a node i,
$\lambda_{xy}$ represents an annual fault rate of a branch xy,
$\tau_{xy}^{SW}$ represents an interruption duration of the branch xy from a fault occurrence to a load restoration is applied,
$\tau_{xy}^{RP}$ represents an interruption duration of the branch xy from the fault occurrence to the fault is repaired,
$p_i^{xy} \in \{0,1\}$ represents whether the node i is affected when a fault occurs in the branch xy, $p_i^{xy}=1$ represents that the node i is affected when the fault occurs in the branch xy, and $p_i^{xy}=0$ represents that the node i is not affected when the fault occurs in the branch xy,
$q_i^{xy} \in \{0,1\}$ represents whether the node i is powered when the fault occurs in the branch xy, $q_i^{xy}=1$ represents that the node i is powered when the fault occurs in the branch xy, and $q_i^{xy}=0$ represents that the node i is not powered when the fault occurs in the branch xy,
$\Psi^{LN}$ represents a set of nodes having loads,
$CIF_i$ represents a customer interruption frequency of the node i,
SAIDI represents a system average interruption duration index,
SAIFI represents a system average interruption frequency index,
$NC_i$ represents a number of customers of the node i,
ASAI represents a system average power-supply index,
EENS represents an expected energy not supplied,
B represents a set of all load levels,
$\Delta_h$ represents a number of annual duration hours of a load level h,
$\mu_h \leq 1$ represents a peak load ratio of the load level h, and
$L_i$ represents a peak load of the node i.

9. The method of claim 8, wherein the constraint of the indices of the reliability is denoted by formulas of:

$$CID_i \leq \varepsilon_i, \forall i \in \Psi^{LN} \quad (27)$$

$$SAIDI \leq \varepsilon \quad (28)$$

where:
$\varepsilon_i$ represents a requirement for the customer interruption duration, and
$\varepsilon$ represents a requirement for the system average interruption duration.

10. The method of claim 2, wherein the logic constraint is denoted by formulas of:

$$l_{ij} = \sum_{a \in \Lambda^B} l_{ij}^a, \forall ij \in \Upsilon \quad (29)$$

$$P_{ij}^C = \sum_{a \in \Lambda^B} C_B^a l_{ij}^a, \forall ij \in \Upsilon \quad (30)$$

$$k_{ij}^{xy} \leq l_{ij}, \forall ij \in \Upsilon, \forall xy \in \Upsilon \cup \{0\} \quad (31)$$

$$o_f = \sum_{a \in \Lambda^T} o_f^e, \forall f \in \Psi^F \quad (32)$$

$$P_f^C = \sum_{a \in \Lambda^T} o_f^e C_T^e, \forall f \in \Psi^F \quad (33)$$

$$\sum_{f \in \Psi_s^{SS}} o_f \leq M u_s, \forall s \in \Psi^{SS} \quad (34)$$

where:
$l_{ij} \in \{0,1\}$ represents whether there is the branch ij, $l_{ij}=1$ represents that there is the branch ij, $l_{ij}=0$ represents that there is no branch ij,
$C_B^a$ represents a rated capacity of the conductor with the conductor type a,
$P_{ij}^C$ represents a rated capacity of the branch ij,
$k_{ij}^{xy} \in \{0,1\}$ represents a state of a switch in the branch ij when a fault occurs in a branch xy, $k_{ij}^{xy}=1$ represents that the switch is turned off, $k_{ij}^{xy}=0$ represents that the switch is turned on,
$o_f \in \{0,1\}$ represents whether there is a newly-installed node f, $o_f=1$ represents that there is the newly-installed node f, $o_f=0$ represents that there is no the newly-installed node f,
$C_T^e$ represents that a rated capacity of the newly-installed transformer with the transformer type e,
$P_f^C$ represents a capacity of the transformer f,
M represents a positive number, and
$\Psi_s^{SS}$ represents a set of transformers belonging to a substation node s.

11. An apparatus for planning a power distribution network, comprising:
a processor; and
a memory for storing instructions executable by the processor;
wherein the processor is configured to carry out:
establishing a model for planning the power distribution network,
the model comprising a target function and constraints,
the target function for minimizing a cost of the power distribution network when conductors, transformers, and substations are installed in the power distribution network,
the constraints comprising a power balance constraint of the power distribution network, a power constraint of branches in the power distribution network, a power constraint of transformers in the power distribution network, a radial operation constraint of the power distribution network, a fault constraint, a constraint of indices of a reliability, a calculation definition of the constraint of the indices of the reliability, and a logic constraint;
solving the model to obtain a solution about placing the conductors, the transformers, and the substations for planning the power distribution network; and planning and operating the power distributed network based on the obtained solution.

12. The apparatus of claim 11, wherein the target function is denoted by a formula of:

$$\text{Minimize: } C^I = \sum_{ij \in \Upsilon} \sum_{a \in \Lambda^B} c_B^a l_{ij}^a + \sum_{f \in \Psi^F} \sum_{e \in \Lambda^T} c_T^e o_f^e + \sum_{s \in \Psi^{SS}} c_s^{SS} u_s \quad (35)$$

where:
$C^I$ represents the cost of the power distribution network,
a represents a conductor type,
$c_B^a$ represents a cost of a conductor with the conductor type a,
$l_{ij}^a \in \{0,1\}$ represents whether the conductor with the conductor type a is installed newly in a branch ij, $l_{ij}^a = 1$ represents that the conductor with the conductor type a is installed newly in the branch ij, $l_{ij}^a = 0$ represents that the conductor with the conductor type a is not installed newly in the branch ij,
$\Upsilon$ represents a set of all branches,
$\Lambda^B$ represents a set of conductor types,
e represents a transformer type,
$c_T^e$ represents a cost of a transformer with the transformer type e,
$o_f^e \in \{0,1\}$ represents whether the transformer with the transformer type e is installed newly in a transformer node f, $o_f^e = 1$ represents that the transformer with the transformer type e is installed newly in the transformer node f, $o_f^e = 0$ represents that the transformer with the transformer type e is not installed newly in the transformer node f,
$\Psi^F$ represents a set of transformer nodes,
$\Lambda^T$ represents a set of transformer types,
$c_s^{SS}$ represents a cost of a substation newly-installed,
$u_s \in \{0,1\}$ represents whether the substation is installed newly in a substation node s, $u_s = 1$ represents that the substation is installed newly in the substation node s, $u_s = 0$ represents the substation is not installed newly in the substation node s, and
$\Psi^{SS}$ represents a set of substation nodes.

13. A non-transitory computer-readable storage medium having stored therein instructions that, when executed by a processor of a terminal, causes the terminal to perform a method for planning a power distribution network, the method comprising:
establishing a model for planning the power distribution network,
the model comprising a target function and constraints,
the target function for minimizing a cost of the power distribution network when conductors, transformers, and substations are installed in the power distribution network,
the constraints comprising a power balance constraint of the power distribution network, a power constraint of branches in the power distribution network, a power constraint of transformers in the power distribution network, a radial operation constraint of the power distribution network, a fault constraint, a constraint of indices of a reliability, a calculation definition of the constraint of the indices of the reliability, and a logic constraint;
solving the model to obtain a solution about placing the conductors, the transformers, and the substations for planning the power distribution network; and
planning and operating the power distributed network based on the obtained solution.

14. The non-transitory computer-readable storage medium of claim 13, wherein the target function is denoted by a formula of:

$$\text{Minimize: } C^I = \sum_{ij \in \Upsilon} \sum_{a \in \Lambda^B} c_B^a l_{ij}^a + \sum_{f \in \Psi^F} \sum_{e \in \Lambda^T} c_T^e o_f^e + \sum_{s \in \Psi^{SS}} c_s^{SS} u_s \quad (36)$$

where:
$C^I$ represents the cost of the power distribution network,
a represents a conductor type,
$c_B^a$ represents a cost of a conductor with the conductor type a,
$l_{ij}^a \in \{0,1\}$ represents whether the conductor with the conductor type a is installed newly in a branch ij, $l_{ij}^a = 1$ represents that the conductor with the conductor type a is installed newly in the branch ij, $l_{ij}^a = 0$ represents that the conductor with the conductor type a is not installed newly in the branch ij,
$\Upsilon$ represents a set of all branches,
$\Lambda^B$ represents a set of conductor types,
e represents a transformer type,
$c_T^e$ represents a cost of a transformer with the transformer type e,
$o_f^e \in \{0,1\}$ represents whether the transformer with the transformer type e is installed newly in a transformer node f, $o_f^e = 1$ represents that the transformer with the transformer type e is installed newly in the transformer node f, $o_f^e = 0$ represents that the transformer with the transformer type e is not installed newly in the transformer node f,
$\Psi^F$ represents a set of transformer nodes,
$\Lambda^T$ represents a set of transformer types,
$c_s^{SS}$ represents a cost of a substation newly-installed,
$u_s \in \{0,1\}$ represents whether the substation is installed newly in a substation node s, $u_s = 1$ represents that the substation is installed newly in the substation node s, $u_s = 0$ represents the substation is not installed newly in the substation node s, and
$\Psi^{SS}$ represents a set of substation nodes.

* * * * *